United States Patent
Rickerby

(10) Patent No.: US 6,176,982 B1
(45) Date of Patent: Jan. 23, 2001

(54) METHOD OF APPLYING A COATING TO A METALLIC ARTICLE AND AN APPARATUS FOR APPLYING A COATING TO A METALLIC ARTICLE

(75) Inventor: David S Rickerby, Derby (GB)

(73) Assignee: Rolls-Royce, PLC., London (GB)

(*) Notice: Under 35 U.S.C. 154(b), the term of this patent shall be extended for 0 days.

(21) Appl. No.: 09/407,979

(22) Filed: Sep. 29, 1999

(30) Foreign Application Priority Data

Oct. 9, 1998 (GB) .................................................. 9821903

(51) Int. Cl.[7] .......................... C23C 14/38; C23C 14/58; C23C 14/16

(52) U.S. Cl. ............................... 204/192.15; 204/192.12; 204/192.16; 204/192.32; 204/192.35; 204/298.06; 204/298.12; 204/298.13; 204/298.31; 204/298.34; 204/192.22; 204/298.35; 204/298.23; 204/298.24; 204/298.25; 204/298.26; 204/298.21; 204/298.07

(58) Field of Search ........................ 204/192.12, 192.15, 204/192.16, 192.32, 192.35, 298.06, 298.12, 298.13, 298.31, 298.34, 192.22, 298.35, 298.21, 298.23, 298.24, 298.25, 298.26, 298.07

(56) References Cited

U.S. PATENT DOCUMENTS

| | | |
|---|---|---|
| 4,521,286 | 6/1985 | Horwitz . |
| 4,637,853 | 1/1987 | Bumble et al. . |
| 4,915,805 | 4/1990 | Rust . |
| 5,013,419 * | 5/1991 | Richerby et al. ............... 204/298.05 |
| 5,178,743 | 1/1993 | Kumar ............................ 204/298.21 |
| 5,242,561 * | 9/1993 | Sato ................................ 204/192.33 |
| 5,317,006 * | 5/1994 | Kumar ............................ 204/298.12 |
| 5,437,778 | 8/1995 | Hedgcoth . |
| 5,457,298 | 10/1995 | Nelson et al. . |
| 5,490,910 | 2/1996 | Nelson et al. .................. 204/192.15 |
| 5,529,674 * | 6/1996 | Hedgcoth ....................... 204/298.21 |
| 5,665,165 * | 9/1997 | Spencer et al. ....................... 118/718 |
| 5,716,505 | 2/1998 | Scherer . |
| 5,846,608 * | 12/1998 | Neumann et al. .................... 427/529 |

FOREIGN PATENT DOCUMENTS

| | | |
|---|---|---|
| 23-36-825 | 7/1973 | (DE) . |
| 42 35 953 C2 | 4/1994 | (DE) . |
| 0-010-971-A2 | 11/1979 | (EP) . |
| 0-208-487-A2 | 6/1986 | (EP) . |
| 455408 * | 11/1991 | (EP) . |
| 0 634 778 A1 | 1/1995 | (EP) . |
| 2-261-226 | 5/1993 | (GB) . |
| WO 98/10114 | 3/1998 | (WO) . |

* cited by examiner

*Primary Examiner*—Alan Diamond
(74) *Attorney, Agent, or Firm*—Oliff & Berridge, PLC

(57) ABSTRACT

A method of applying a coating to a metallic article (10) comprises placing the metallic article within a hollow cathode (38) in a vacuum chamber (30), evacuating the vacuum chamber (30), applying a negative voltage to the hollow cathode (38) to produce a plasma and such that the material of the hollow cathode (38) is sputtered onto the metallic article (10) to produce a coating (22). A positive voltage ($V_1$) is applied to the metallic article (10) to attract electrons from the plasma to heat the coating (22) and so inter-diffuse the elements of the metallic article (10) and the protective coating (22) and a negative voltage ($V_2$) is applied to the metallic article (10) to attract ions from the plasma to bombard the coating (22) to minimize defects in the coating (22).

44 Claims, 4 Drawing Sheets

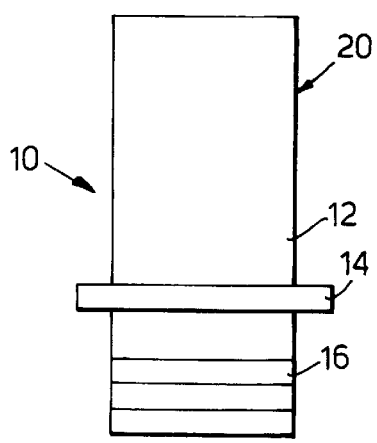
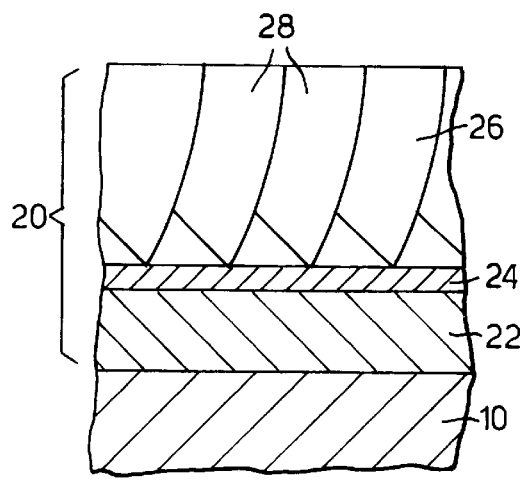
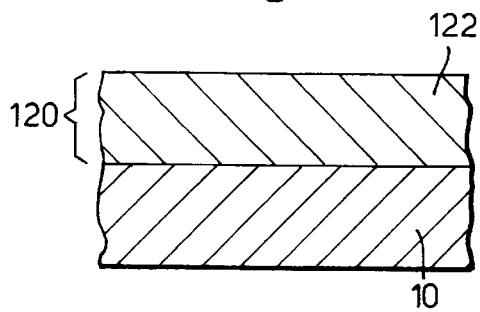
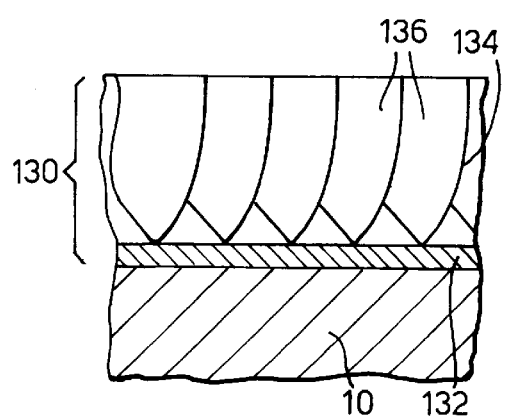

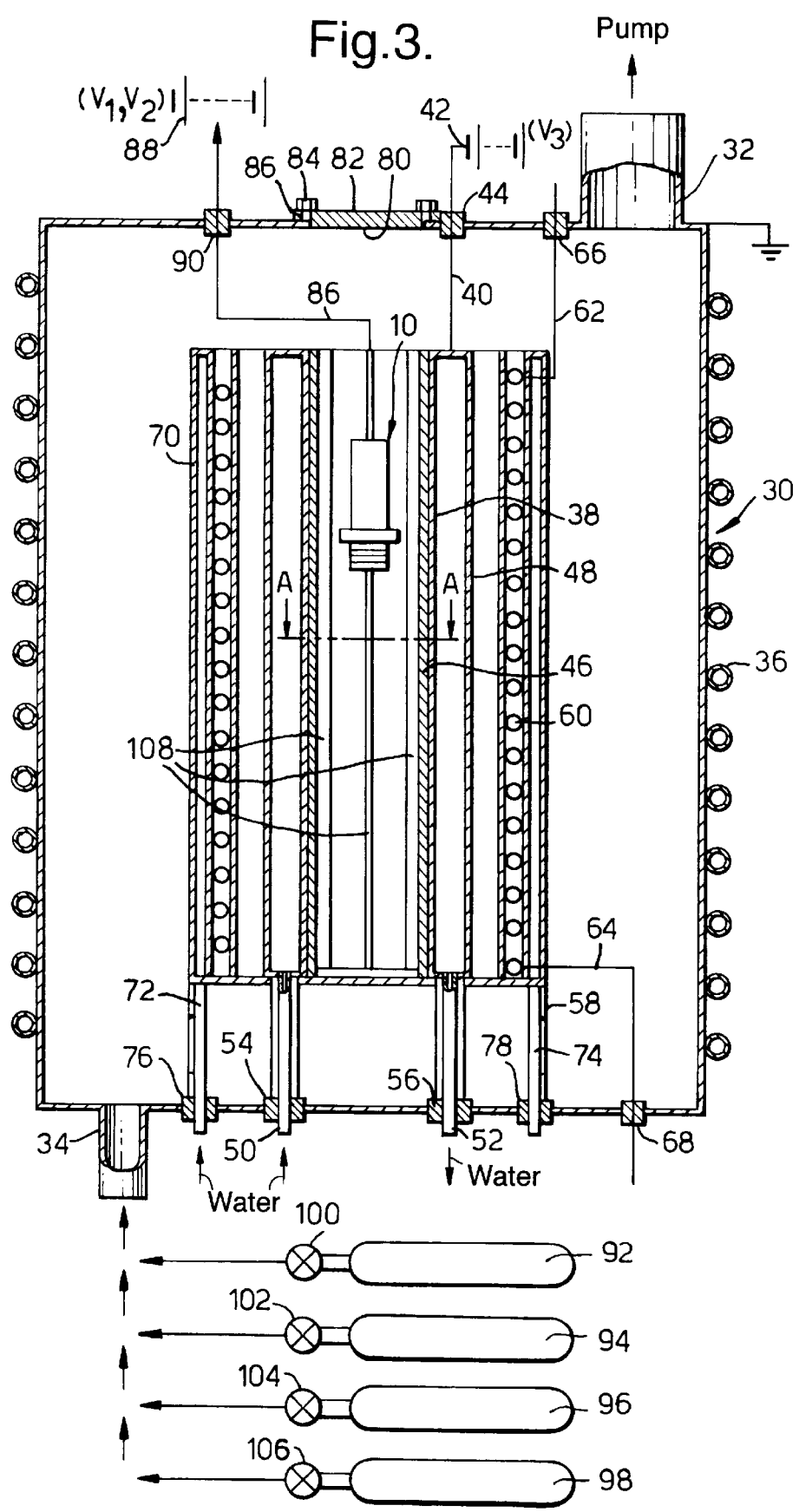

METHOD OF APPLYING A COATING TO A METALLIC ARTICLE AND AN APPARATUS FOR APPLYING A COATING TO A METALLIC ARTICLE

BACKGROUND OF THE INVENTION

1. Field of Invention

The present invention relates to a method of applying a coating to a metallic article, particularly to a method of applying an environmental protective coating and/or a thermal barrier coating to a metallic article.

2. Description of Related Art

Environmental protective coatings include aluminide platinum coatings, chromium coatings, MCrAlY coatings (where M is one or more of Fe, Ni and Co), silicide coatings, platinum modified aluminide coatings, chromium modified aluminide coatings, platinum and chromium modified aluminide coatings, silicide modified aluminide coatings, platinum and silicide modified aluminide coatings and platinum, silicide and chromium modified aluminide coatings etc. Aluminide coatings are generally applied by the well known pack aluminising, out of pack, vapour, aluminising or slurry aluminising processes. Platinum coatings are generally applied by electroplating or sputtering. Chromium coatings are generally applied by pack chromising or vapour chromising. Silicide coatings are generally applied by slurry aluminising. MCrAlY coatings are generally applied by plasma spraying or electron beam physical vapour deposition.

Thermal barrier coatings include yttria stabilised zirconia and magnesia stabilised zirconia etc. Thermal barrier coatings are generally applied by plasma spraying or electron beam physical vapour deposition.

SUMMARY OF THE INVENTION

Accordingly the present invention seeks to provide a novel method of applying a coating to a metallic article.

Accordingly the present invention provides a method of applying a coating to a metallic article comprising providing a sputtering chamber having a first hollow cathode, the first hollow cathode comprising a material to form a protective coating, placing the metallic article within the first hollow cathode, evacuating the sputtering chamber, applying a negative voltage to the first hollow cathode to produce a plasma and such that the material of the hollow cathode is sputtered onto the metallic article to produce the protective coating, applying a positive voltage to the metallic article to attract electrons from the plasma to heat the protective coating and so inter-diffuse the elements of the metallic article and the protective coating, and applying a negative voltage to the metallic article to attract ions from the plasma to bombard the protective coating to minimise defects in the protective coating.

The hollow cathode material may comprise aluminium, platinum, yttrium, chromium, MCrAlY or an alloy mixture of any two or more of aluminium, platinum, yttrium, chromium or MCrAlY.

The hollow cathode may comprise a plurality of longitudinally arranged portions, the portions comprise different materials, passing the metallic article sequentially through the hollow cathode portions to deposit layers of different material sequentially on the metallic article.

The different materials may comprise two or more of aluminium, platinum, yttrium, chromium and MCrAlY.

The method may comprise the additional step of supplying at least one gas into the sputtering chamber and applying a negative voltage to the metallic article to produce a plasma to clean the surface of the metallic article before depositing the protective coating.

Preferably the method comprises alternately applying the positive voltage and the negative voltage to the metallic article.

The method may comprise selecting the magnitude and the duration of the positive voltage applied to the metallic article so that the elements from the protective coating diffuse into the metallic article.

Alternatively the method may comprise selecting the magnitude and the duration of the positive voltage applied to the metallic article so that the elements from the metallic article diffuse into the protective coating.

The method may comprise supplying a reactive gas into the sputtering chamber to form a dispersion strengthened protective coating.

Preferably the hollow cathode may comprise one or more projections extending from the hollow cathode towards the metallic article.

Preferably the length of the individual projections and/or the spacing between the projections is selected to produce variations in the thickness of the protective coating at predetermined regions on the metallic article.

Some of the projections may be formed from different materials to the remaining projections to produce variations in the composition of the protective coating at a predetermined region on the metallic article.

A transverse portion of the hollow cathode may be formed from different materials to the remainder of the hollow cathode to produce a variation in the composition of the protective coating at a predetermined region on the metallic article.

Preferably the method comprises the additional steps of providing a sputtering chamber having a second hollow cathode, the second hollow cathode comprising an inert material, supplying precursor gases into the sputtering chamber, the precursor gases being suitable for forming a thermal barrier coating, applying a negative voltage to the hollow cathode to produce a plasma so that the precursor gases react in the plasma and deposit a thermal barrier coating on the protective coating.

Preferably the method additionally comprises supplying at least one gas into the sputtering chamber and applying a negative voltage to the metallic article to produce a plasma to clean the surface of the protective coating before depositing the thermal barrier coating.

Preferably the reactive gases comprise zirconium chloride and yttrium chloride to deposit a yttria stabilised zirconia thermal barrier coating on the protective coating.

Preferably the metallic article comprises a nickel superalloy, a cobalt superalloy or an iron superalloy.

Preferably the metallic article comprises a turbine blade or a turbine vane.

A further method of applying a coating to a metallic article according to the present invention comprises the steps of providing a sputtering chamber having a hollow cathode, the hollow cathode comprising an inert material, supplying precursor gases into the sputtering chamber, the precursor gases being suitable for forming a thermal barrier coating, applying a negative voltage to the hollow cathode to produce a plasma so that the precursor gases react in the plasma and deposit a thermal barrier coating on the metallic article.

Preferably the method additionally comprises supplying at least one gas into the sputtering chamber and applying a negative voltage to the metallic article to produce a plasma to clean the surface of the metallic article before depositing the thermal barrier coating.

Preferably the reactive gases comprise zirconium chloride and yttrium chloride to deposit a yttria stabilised zirconia thermal barrier coating on the metallic article.

Preferably the method comprises applying different negative voltages to the hollow cathode to produce layers in the thermal barrier coating which have different structures.

Preferably the metallic article comprises a nickel superalloy, a cobalt superalloy or an iron superalloy.

Preferably the metallic article comprises a turbine blade or a turbine vane.

Preferably the method comprises depositing a bond coating on the metallic article before depositing the thermal barrier coating.

The present invention also seeks to provide a novel apparatus for applying a coating to a metallic article.

Accordingly the present invention provides an apparatus for applying a coating to a metallic article comprising a sputtering chamber having a first hollow cathode, the first hollow cathode comprising a material to form a protective coating, means to evacuate the sputtering chamber, means to apply a negative voltage to the first hollow cathode to produce a plasma and such that the material of the hollow cathode is sputtered onto the metallic article to produce the protective coating, means to apply a positive voltage to the metallic article to attract electrons from the plasma to heat the protective coating and so inter-diffuse the elements of the metallic article and the protective coating, and means to apply a negative voltage to the metallic article to attract ions from the plasma to bombard the protective coating to minimise defects in the protective coating.

The hollow cathode material may comprise aluminium, platinum, yttrium, chromium, MCrAlY or an alloy mixture of any two or more of aluminium, platinum, yttrium, chromium or MCrAlY.

The hollow cathode may comprises a plurality of longitudinally arranged portions, the portions comprise different materials.

The different materials may comprise two or more of aluminium, platinum, yttrium, chromium and MCrAlY.

Preferably the apparatus comprises means to supply at least one gas into the sputtering chamber and means to apply a negative voltage to the metallic article to produce a plasma to clean the surface of the metallic article before depositing the protective coating.

Preferably the apparatus comprises means to alternately apply the positive voltage and the negative voltage to the metallic article.

The apparatus may comprise means to select the magnitude and the duration of the positive voltage applied to the metallic article so that the elements from the protective coating diffuse into the metallic article.

The apparatus may comprise means to select the magnitude and the duration of the positive voltage applied to the metallic article so that the elements from the metallic article diffuse into the protective coating.

Preferably the apparatus comprises means to supply a reactive gas into the sputtering chamber to form a dispersion strengthened protective coating.

Preferably the hollow cathode comprises one or more projections extending from the hollow cathode towards the metallic article.

Preferably the length of the individual projections and the spacing between the projections is arranged to produce variations in the thickness of protective coating at predetermined regions on the metallic article.

Preferably some of the projections are formed from different materials to the remaining projections to produce variations in the composition of the protective coating at a predetermined region on the metallic article.

A transverse portion of the hollow cathode may be formed from different materials to the remainder of the hollow cathode to produce a variation in the composition of the protective coating at a predetermined region on the metallic article.

Preferably the apparatus comprises a sputtering chamber having a second hollow cathode, the second hollow cathode comprising an inert material, means to supply precursor gases into the sputtering chamber, the precursor gases being suitable for forming a thermal barrier coating, means to apply a negative voltage to the hollow cathode to produce a plasma so that the precursor gases react in the plasma and deposit a thermal barrier coating on the protective coating.

Preferably the apparatus comprises means to supply at least one gas into the sputtering chamber and means to apply a negative voltage to the metallic article to produce a plasma to clean the surface of the protective coating before depositing the thermal barrier coating.

Preferably the apparatus comprises means to apply different negative voltages to the hollow cathode to produce layers in the thermal barrier coating.

Preferably the means to supply reactive gases comprises a supply of zirconium chloride and yttrium chloride.

Preferably the second hollow cathode is in a second sputtering chamber.

Preferably the first and second sputtering chambers are connected by an air lock.

Preferably the first and second hollow cathodes are cylindrical.

BRIEF DESCRIPTION OF THE DRAWINGS

The present invention will be more fully described by way of example with reference to the accompanying drawings in which;

FIG.1 shows a gas turbine engine turbine blade having a coating applied by a method according to the present invention.

FIG. 2 is a cross-sectional view through a coating applied by a method according to the present invention.

FIG. 3 is a cross-sectional view through an apparatus to deposit a coating by a method according to the present invention.

FIG. 6 is a cross-sectional view through a further coating applied by a method according to the present invention.

FIG. 7 is a cross-sectional view through another coating applied by a method according to the present invention.

DETAILED DESCRIPTION OF PREFERRED EMBODIMENTS

Figure 4:
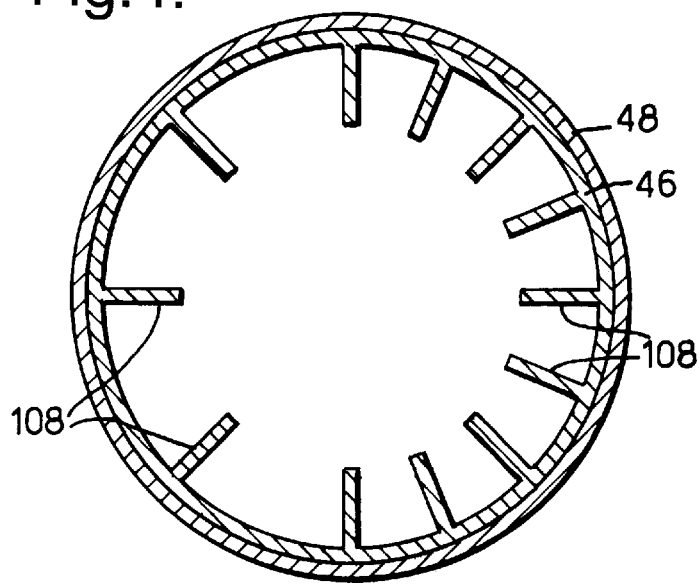
FIG. 4 is a cross-sectional view in the direction of Arrows A—A through the apparatus in FIG. 3.

A gas turbine engine turbine blade 10, as shown in FIG. 1, comprises an aerofoil 12, a platform 14 and a root 16. The aerofoil 12 of the turbine blade 10 has a coating 20.

The coating 20, as shown more clearly in FIG. 2, comprises a bond coating 22, an oxide layer 24 and a ceramic thermal barrier coating 26. The bond coating 22 may be an aluminide coating, a platinum aluminide coating, an MCrAlY coating or any two or more of these, for example a MCrAlY coating with a platinum aluminide between the MCrAlY coating and the turbine blade or a platinum aluminide coating with a MCrAlY coating between the platinum aluminide coating and the turbine blade. Yttrium, chromium, and other beneficial elements may also be included in the aluminide coatings by providing the elements in the inner wall.

The oxide layer 24 comprises alumina to adhere the ceramic thermal barrier coating 26 to the bond coating 22.

The ceramic thermal barrier coating zirconia preferably comprises yttria stabilised zirconia, although other suitable ceramics may be used. The ceramic thermal barrier coating 26 comprises a plurality of columnar grains 28 which extend substantially perpendicularly from the surface of the turbine blade 10.

An apparatus for depositing the coating 20 is shown in FIGS. 3 and 4. The apparatus comprises a vacuum chamber 30 which is evacuated by means of a vacuum pump (not shown) via an outlet port 32. The vacuum chamber 30 is supplied with various gases, at various times, from suitable supplies via an inlet port 34. A coiled pipe 36 is provided around the vacuum chamber 30, and the coiled pipe 36 is supplied with water to cool the vacuum chamber 30. A cylindrical electrode 38 is provided within the vacuum chamber 30 and the electrode 38 is electrically connected, via a wire 40, to a negative terminal of an electrical power supply 42. The wire 40 passes through the wall of the vacuum chamber 30 and is electrically insulated from the wall by an insulator 44. Thus the cylindrical electrode forms a hollow cathode in operation when a negative potential is supplied to it from the power supply 42.

The cylindrical electrode 38 comprises an inner wall 46 which is manufactured from a material to be deposited upon a turbine blade 10, or the inner wall 46 is manufactured from a material which is relatively inert to gases supplied into the vacuum chamber 30. The cylindrical electrode 38 also comprises a hollow annular tank 48 which surrounds and is in intimate thermal contact with the inner wall 46. The hollow tank 48 is provided with an inlet pipe 50 and an outlet pipe 52 and the hollow tank 48 is supplied with water, form a supply of water (not shown) via the inlet pipe 50 to cool the cylindrical electrode 38. The used water is discharged from the hollow tank 48 via the outlet pipe 52. The hollow tank 48 allows water to be circulated against the inner wall 46 of the hollow electrode 38 thereby cooling the cylindrical electrode 38. The inlet and outlet pipes 50 and 52 pass through the wall of the vacuum chamber 30 via insulated lead throughs 54 and 56 respectively. The cylindrical electrode 38 is mounted from the vacuum chamber 30 by a support 58 which insulates the cylindrical electrode 38 from the vacuum chamber 30. The vacuum chamber 30 is earthed.

A magnetic coil 60 is positioned coaxially around the cylindrical electrode 38 and is spaced radially from the hollow tank 48. The magnetic coil 60 is electrically connected via electric cables 62 and 64 to an electrical power supply (not shown). The cables 62 and 64 pass through the wall of the vacuum chamber 30 via insulated lead throughs 66 and 68 respectively. The magnetic coil 60 is surrounded by a second hollow annular tank 70 which is intimate thermal contact with the magnetic coil 60. The second hollow tank 70 is provided with an inlet pipe 72 and an outlet pipe 74 and the second hollow tank 70 is supplied with water, from a supply of water (not shown) via the inlet pipe 72, to cool the magnetic coil 60. The used water is discharged from the second hollow tank 70 via the outlet pipe 74. The second hollow tank 70 allows water to be circulated around the magnetic coil 60. The inlet and outlet pipes 72 and 74 pass through the wall of the vacuum chamber 30 via insulating lead throughs 76 and 78 respectively.

The inner wall 46 of the cylindrical electrode 38 as mentioned previously may be made from a material to be deposited onto the metallic article. In this case the inner wall 46 may be made in the form of separate plates of different materials which can be energised independently to enable the composition of the coating to be varied. For example the inner wall 46 may be made of alternate plates of aluminium and platinum to deposit layers of aluminium and platinum to form a platinum aluminide coating.

The inner wall 46 of the cylindrical electrode 38 may be made from an inert material so that reactive gases may be supplied into the cylindrical electrode 38 to react either to deposit a coating on the metallic article 10, or to react with undesirable elements on the metallic article 10 so as to clean the metallic article 10. If the inner wall 46 is made from an inert material a non reactive gas may be supplied into the cylindrical electrode 38 to clean the metallic article 10.

Thus the cylindrical electrode 38 may be made from plates of material to be deposited and plates of inert material all of which may be energised independently.

The inner wall 46 of the cylindrical electrode 38 preferably comprises projections 108 which extend substantially radially towards the axis of the cylindrical electrode 38. The radial projections 108 enhance the plasma formed in the cylindrical electrode 38.

The radial projections 108 may be arranged with uniform circumferential spacing between projections 108 or may be arranged with different circumferential spacing between projections 108. The use of radial projections 108 with uniform circumferential spacing increases the coating rate and provides the correct plasma density. The radial projections 108 shown in FIG. 4 are arranged with a larger circumferential spacing between the projections 108 at the left hand side of the inner wall 46 than at the right hand side of the inner wall 46.

The radial projections 108 may be arranged with uniform radial lengths or may be arranged with different radial lengths. The radial projections 108 may comprise the same, or a different material, to that of the inner wall 46. The radial projections 108 shown in FIG. 4 are arranged with a larger radial lengths at the left hand side of the inner wall 46 than at the right hand side of the inner wall 46.

The vacuum chamber 30 is provided with an opening 80 to enable articles to be loaded into the vacuum chamber 30. The opening 80 is provided with a door 82 which is used to close and seal the opening 80. The door 80 as shown is secured to the vacuum chamber 30 by nuts 84 which are threaded onto studs 86 placed around the opening 80. Alternatively, the door may be hinged to the vacuum chamber 30 and closed and sealed in other suitable ways.

The metallic article, a turbine blade or a turbine vane, 10 to be coated is placed in the cylindrical electrode 38 and the article 10 is electrically connected, via a wire 86, to a power supply 88. The wire 86 passes through the wall of the vacuum chamber 30 and is electrically insulated from the wall by an insulator 90.

The inlet port 34 is connected to gas bottles, or gas generators, 92, 94, 96 and 98 via valves 100, 102, 104 and 106 respectively. The gas bottle, or gas generator, 92 contains argon to support the formation of a glow discharge, or plasma, in the vacuum chamber 30. The gas bottle, or gas generator, 94 contains hydrogen, or other suitable reactive or non reactive gas, to enable cleaning of the metallic article 10. The gas bottle, or gas generator, 96 comprises zirconium chloride, or other suitable gas which will react to form a ceramic thermal barrier coating. The gas bottle, or gas generator, 98 contains yttrium chloride, or other suitable gas which will react to form a ceramic for incorporation in the ceramic thermal barrier coating formed by the reaction of the gas in gas bottle, or gas generator 96.

In order to produce the coating 20, shown in FIGS. 1 and 2, a bond coating 22 is firstly deposited onto the metallic article 10. To deposit the bond coating 22, the inner wall 46 of the cylindrical electrode 38 comprises one or more materials to be deposited on the metallic article 10. The inner wall 46 may comprise a number of plates of different materials or the inner wall may comprise an alloy or mixture of the different materials, or the radial projections 108 and the inner wall 46 may comprise different materials. For example to produce a simple aluminide bond coating 22 the inner wall 46 comprises only aluminium, to produce a simple platinum bond coating 22 the inner wall 46 comprises only platinum, and to produce a MCrAlY bond coating 22 the inner wall 46 comprises MCrAlY. To produce a platinum aluminide bond coating 22 the inner wall 46 comprises alternate plates of platinum and aluminium, or the inner wall 46 comprises an alloy or mixture of platinum and aluminium or the radial projections 108 comprise platinum and the inner wall 46 comprises aluminium or visa-versa. To produce a bond coating 22 comprising platinum aluminide on MCrAlY the inner wall 46 comprises alternate plates of MCrAlY, platinum and aluminium.

The vacuum chamber 30 is evacuated to a pressure of about $1 \times 10^{-3}$ Torr and is heated to assist in out-gassing the interior of the vacuum chamber 30. When the required pressure is reached, within the vacuum chamber 30, an inert gas for example argon is supplied into the vacuum chamber 30 from the gas bottle 92 via valve 100 and inlet port 34. The inert gas enables a glow discharge, or plasma, to be set up within the cylindrical electrode 38. Suitable pressures are in the range $5 \times 10^{-1}$ to $1 \times 10^{-3}$ Torr and suitable cylindrical electrode potentials are in the range of 300 to 900 volts.

The negative voltage on the cylindrical electrode 38 causes the material of the inner wall 46, or inner wall 46 and radial projections 108, to be sputtered onto the metallic article 10 to produce the bond coating 22. The voltage applied to the cylindrical electrode 38 may be varied to control the rate at which the material is sputtered onto the metallic article 10.

Figure 5:
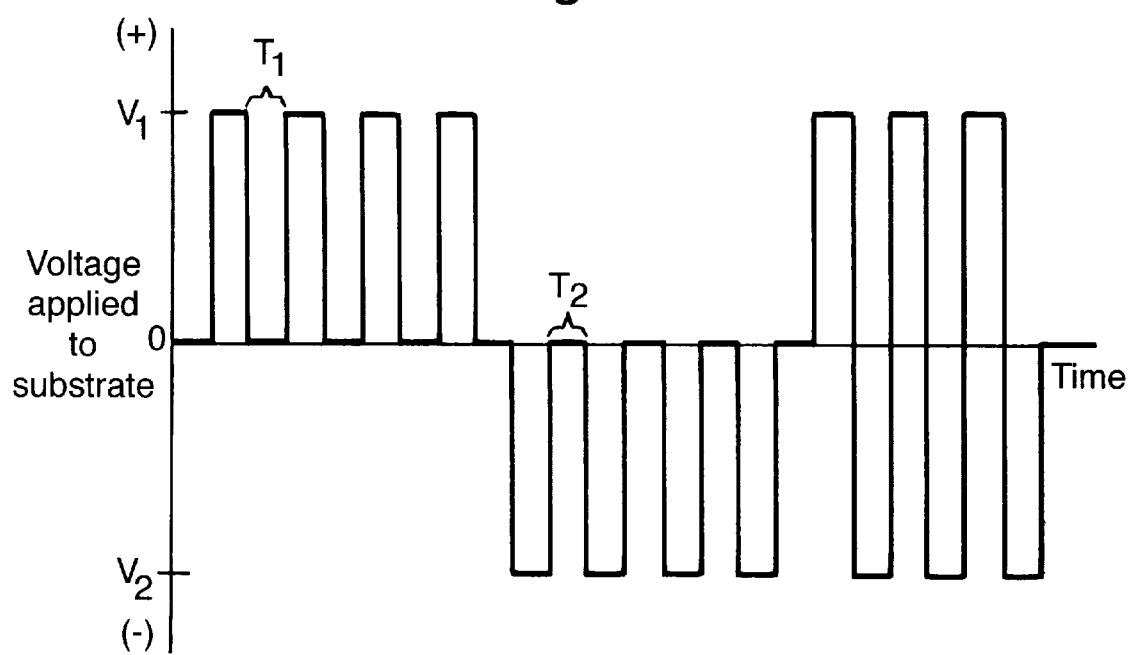
FIG. 5 is a graph of voltage applied to a substrate during a method according to the present invention.

The voltage applied to the metallic article 10 during the deposition of the bond coating 22 from the inner wall 46 of the cylindrical electrode 38 may be varied to control the bond coating 22. Thus, as shown in FIG. 5, as the bond coating 22 is deposited the voltage is varied periodically between a negative voltage $V_2$ and a positive voltage $V_1$. The negative voltage $V_2$ is applied to the metallic article 10 to cause ions, argon ions, to be attracted to the metallic article 10, and the ions bombard the surface of the bond coating 22 densifying the bond coating 22 and minimising or removing any defects in the bond coating 22. The positive voltage $V_1$ is applied to the metallic article 10 to cause electrons to be attracted to the metallic article 10 to heat the metallic article 10 to produce inter-diffusion between the elements in the metallic article 10 and the elements in the bond coating 22.

The magnitude of the negative voltage $V_2$ and the time $T_2$ for which it is applied controls the effectiveness of the densification and the removal of any defects. The magnitude of the positive voltage $V_1$ and the time $T_1$ for which it is applied controls the effectiveness of the heating of the metallic article 10. Thus by appropriate selection of the voltages $V_1$ and $V_2$ and times $T_1$ and $T_2$ appropriate densification may be produced and the type of bond coating 22 may be selected. If high heating effectiveness is selected the bond coating 22 is an inward diffusion type or if low heating effectiveness is selected the bond coating 22 is an outward diffusion type.

The magnetic coil 60 is additionally used to control the number of electrons attracted to the metallic article 10. The magnetic field may be increased to decrease the number of electrons attracted to the metallic article 10 to prevent overheating of the metallic article 10 and to ensure that the required type of inter-diffusion of the elements between the metallic article 10 and the bond coating 22 is achieved. The magnetic field may be decreased to increase the number of electrons attracted to the metallic article 10 to increase heating and to ensure that the required type of interdiffusion of the elements between the metallic article 10 and the bond coating 22 is achieved.

If the bond coating 22 is not a simple bond coating the metallic article 10 may be moved axially in the cylindrical electrode 38 so that it is within the appropriate plate for the material to be deposited.

Thus one of the advantages of the invention is that the method of the present invention both deposits the bond coating, minimises defects and inter-diffuses the elements of the bond coating and metallic article in one process. Another advantage of the invention is that it obviates the requirement for the standard pack aluminising or vapour aluminising processes which use aluminium halides as carriers for the aluminium and the subsequent heat treatment steps.

The radial projections 108 generally enhance the plasma field between the projections 108 leading to high a high deposition rate of material from the radially inner ends of the projections 108. However, if the circumferential spacing between the radial projections 108 is below a predetermined value the plasma is not enhanced. The radial projections 108 at the right hand side of FIG. 4 are closer together than those at the left hand side so that there is no enhancement of the plasma at the right hand side of the cylindrical electrode 38. This results in deposition of thicker bond coatings 22 at that side of the metallic article 10 compared to the other side. The radial projections 108 at the left hand side of the inner wall 46 are longer resulting in deposition of thicker bond coatings 22 at that side of the metallic article 10 compared to the other side.

Another advantage of the invention is that the thickness of the bond coating at different regions of the metallic article may be controlled by the projections. For example the concave surface and the leading edge of the turbine blade may be provided with a thicker bond coating. A further advantage is that the composition of the bond coating at different regions of the metallic article may be controlled by the projections. For example the concave surface and the leading edge of the turbine blade may be provided with a platinum aluminide coating and the remainder may be provided with an aluminide coating.

It may also be possible to introduce a reactive gas into the vacuum chamber 30 during the deposition of the bond coating 22, for example oxygen may be introduced if the bond coating 22 contains yttrium such that the yttrium oxidises to form yttria in the bond coating 22. This is known as an oxide dispersed bond coating.

Then the ceramic thermal barrier coating 28 is deposited onto the bond coating 22. To deposit the ceramic thermal barrier coating 22, the inner wall 46 of the cylindrical electrode 38 comprises an inert material. The vacuum chamber 30 is evacuated to a pressure of about $1 \times 10^{-3}$ Torr and is heated to assist in out-gassing the interior of the vacuum chamber 30. When the required pressure is reached within the vacuum chamber 30 an inert gas for example argon is supplied into the vacuum chamber 30 from the gas bottle 92 via valve 100 and inlet port 34. The inert gas enables a glow discharge, or plasma, to be set up within the cylindrical electrode 38. Suitable pressures are in the range $5 \times 10^{-1}$ to $1 \times 10^{-3}$ Torr and suitable cylindrical electrode potentials are in the range of 300 to 900 volts.

Suitable reactive gases, zirconium chloride and another gas to react with the zirconium chloride, are supplied from gas bottle 96 via valve 104 and inlet port 34 into the vacuum chamber 30. The plasma within the cylindrical electrode 38 promotes reaction of the gases, and a zirconia ceramic thermal barrier coating 26 is deposited onto the bond coating 22. An oxide layer 24 is produced on the bond coating 22 while the metallic article 10 is in the vacuum chamber 10 and is being evacuated and heated up to operating temperature due to the presence of some oxygen in the vacuum chamber 10.

If desirable an additional suitable reactive gas, yttrium chloride, may be supplied from gas bottle 98 via valve 98 and inlet port 34 into the vacuum chamber 10. The plasma within the cylindrical electrode 38 promotes reaction of the gases, zirconium chloride, yttrium chloride and another gas to react with the zirconium chloride and yttrium chloride, and a yttria stabilised zirconia ceramic thermal barrier coating 26 is deposited onto the bond coating 22.

An advantage of the method of the present invention is that the ceramic thermal barrier coating is deposited at relatively low temperatures compared to conventional chemical vapour deposition.

The ceramic thermal barrier coating 26 deposits on the bond coating 22 as columnar ceramic grains 28 which grow perpendicularly to the surface of the bond coating 22 and the surface of the metallic article 10.

It may be desirable to vary the magnitude of the negative voltage applied to the cylindrical electrode 38 so as to produce layers in the ceramic thermal barrier coating 26 which have different structures. The interfaces between the layers reduce the phonon and or photon thermal conductivity of the ceramic thermal barrier coating 26 by appropriate selection of the thickness of the layers. A thickness of 0.3 to 2 nanometers reduces phonon thermal conductivity and a thickness of 0.5 to 3 microns reduces photon thermal conductivity.

Before the ceramic thermal barrier coating 26 is deposited on the bond coating 22 it may be desirable to supply hydrogen or other suitable gases into the vacuum chamber 30 from the gas bottle 94 via the valve 100 and the inlet port 34. The argon and hydrogen form a plasma to clean the surface of the bond coating 22, for example the hydrogen reacts with sulphur to form hydrogen sulphide. Sulphur is a very undesirable element as regards thermal barrier coatings 26.

Before the bond coating 22 is deposited it may be desirable to supply hydrogen or other suitable gases into the vacuum chamber 30 from the gas bottle 94 via the valve 100 and the inlet port 34. The argon and hydrogen form a plasma to clean the surface of the bond coating 10, for example the hydrogen reacts with sulphur to form hydrogen sulphide. Sulphur is a very undesirable element as regards thermal barrier coatings.

A further coating 120 produced by the present invention is shown in FIG. 6, this simply comprises a protective coating 122 on the metallic article 10. The protective coating 122 may be an aluminide coating, a chromium coating, a platinum coating, a platinum aluminide coating, an MCrAlY coating, an aluminide-silicide coating or any two or more of these, for example a MCrAlY coating with a platinum aluminide coating between the MCrAlY coating and the turbine blade, or a platinum aluminide coating with a MCrAlY coating between the platinum aluminide coating and the turbine blade. Yttrium, chromium and other desirable elements may be provided in the aluminide coatings by providing them in the inner wall.

Another coating 130 produced by the present invention is shown in FIG. 7, this simply comprises an oxide layer 132 on the metallic article 10 and a ceramic thermal barrier coating 134 on the oxide layer 132. The oxide layer 132 comprises alumina to adhere the ceramic thermal barrier coating 26 to the metallic article 10.

The ceramic thermal barrier coating 134 comprises zirconia preferably comprises yttria stabilised zirconia, although other suitable ceramics may be used. The ceramic thermal barrier coating 134 comprises a plurality of columnar grains 136 which extend substantially perpendicularly from the surface of the turbine blade 10.

The method of the present invention may be performed in a single vacuum chamber by selecting the inner wall of the cylindrical electrode of the appropriate material for the particular process step.

Figure 8:
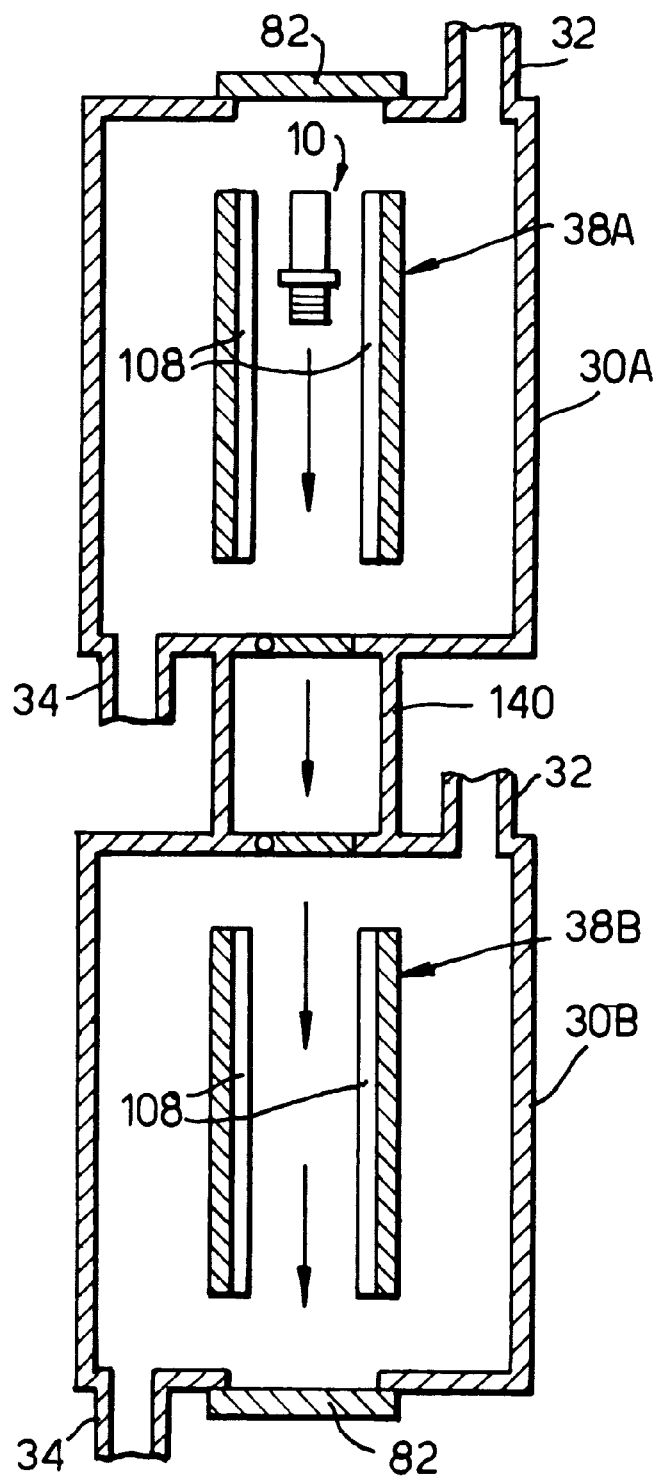
FIG. 8 is a cross-sectional view through another apparatus to deposit a coating by a method according to the present invention.

Alternatively the method of the present invention may be performed using a number of vacuum chambers 30A and 30B, as shown in FIG. 8 each of which has a cylindrical electrode 38A and 38B respectively. The cylindrical electrode 38A and 38B in each vacuum chamber 30A and 30B respectively is of made from the appropriate material for one particular process step and the metallic article 10 is moved sequentially from vacuum chamber 30A to the vacuum chamber 30B. The vacuum chambers 30A and 30B are preferentially connected by an air lock 140 to minimise the processing time. Vacuum chamber 30A is used to deposit the bond coating 22 and vacuum chamber 30B is used to deposit the thermal barrier coating 26.

A further alternative method is to provide the inner wall of the cylindrical electrode with axially separate plates. Each plate is made from the appropriate material for one particular process step and the article moved longitudinally, axially, sequentially through the cylindrical electrode from one plate to another and the plates are energised sequentially.

Although the invention has been described with reference to cylindrical hollow cathode electrodes with circular cross-sections, it may of course be possible to use hollow cathode electrodes of other suitable cross-sections, for example square cross-sections.

I claim:

1. A method of applying a coating to a metallic article comprising providing a sputtering chamber having a first hollow cathode, the first hollow cathode comprising a material to form a protective coating, placing the metallic article within the first hollow cathode, evacuating the sputtering chamber, applying a negative voltage to the first hollow cathode to produce a plasma and such that the material of the hollow cathode is sputtered onto the metallic article to produce the protective coating, applying a positive voltage to the metallic article to attract electrons from the plasma to heat the protective coating and so inter-diffuse the elements of the metallic article and the protective coating, and applying a negative voltage to the metallic article to attract ions from the plasma to bombard the protective coating to minimise defects in the protective coating.

2. A method as claimed in claim 1 wherein the hollow cathode material is selected from the group consisting of aluminium, platinum, yttrium, chromium, MCrAlY where M is one or more of Fe, Ni and Co, and an alloy mixture of any two or more of aluminium, platinum, yttrium, chromium, and MCrAlY where M is one or more of Fe, Ni and Co.

3. A method as claimed in claim 1 wherein the hollow cathode comprises a plurality of longitudinally arranged portions, the portions comprise different materials, and the method further comprises passing the metallic article sequentially through the hollow cathode portions to deposit layers of different material sequentially on the metallic article.

4. A method as claimed in claim 3 wherein the different materials are selected from the group consisting of aluminium, platinum, yttrium, chromium and MCrAlY where M is one or more of Fe, Ni and Co.

5. A method as claimed in claim 1 comprising the additional step of supplying at least one gas into the sputtering chamber and applying a negative voltage to the metallic article to produce a plasma to clean the surface of the metallic article before depositing the protective coating.

6. A method as claimed in claim 1 comprising alternately applying the positive voltage and the negative voltage to the metallic article.

7. A method as claimed in claim 6 comprising selecting the magnitude and the duration of the positive voltage applied to the metallic article so that the elements from the protective coating diffuse into the metallic article.

8. A method as claimed in claim 6 comprising selecting the magnitude and the duration of the positive voltage applied to the metallic article so that the elements from the metallic article diffuse into the protective coating.

9. A method as claimed in claim 1 comprising supplying a reactive gas into the sputtering chamber to form a dispersion strengthened protective coating.

10. A method as claimed in claim 1 wherein the hollow cathode comprises one or more projections extending from the hollow cathode towards the metallic article.

11. A method as claimed in claim 10 comprising selecting the length of the individual projections to produce variations in the thickness of protective coating at regions on the metallic article.

12. A method as claimed in claim 10 comprising selecting the spacing between the projections to produce variations in the thickness of the protective coating at regions on the metallic article.

13. A method as claimed in claim 11 comprising forming some of the projections from different materials to the remaining projections to produce variations in the composition of the protective coating at a region on the metallic article.

14. A method as claimed in claim 1 comprising forming a transverse portion of the hollow cathode from different materials to the remainder of the hollow cathode to produce a variation in the composition of the protective coating at a region on the metallic article.

15. A method of applying a coating as claimed in claim 1 comprising the additional steps of providing a sputtering chamber having a second hollow cathode, the second hollow cathode comprising an inert material, supplying precursor gases into the sputtering chamber, the precursor gases being suitable for forming a thermal barrier coating, and applying a negative voltage to the second hollow cathode to produce a plasma so that the precursor gases react in the plasma and deposit a thermal barrier coating on the protective coating.

16. A method as claimed in claim 15 additionally comprising supplying at least one gas into the sputtering chamber having a second hollow cathode and applying a negative voltage to the metallic article to produce a plasma to clean the surface of the protective coating before depositing the thermal barrier coating.

17. A method as claimed in claim 15 wherein the precursor gases comprise zirconium chloride and yttrium chloride to deposit a yttria stabilised zirconia thermal barrier coating on the protective coating.

18. A method as claimed in claim 1 wherein the metallic article is selected from the group consisting of a nickel superalloy, a cobalt superalloy and an iron superalloy.

19. A method as claimed in claim 1 wherein the metallic article is selected from the group consisting of a turbine blade and a turbine vane.

20. A method of applying a coating to a metallic article comprising the steps of providing a sputtering chamber having a hollow cathode, the hollow cathode comprising an inert material, supplying precursor gases into the sputtering chamber, the precursor gases comprising zirconium chloride and being suitable for forming a thermal barrier coating comprising zirconia, and applying a negative voltage to the hollow cathode to produce a plasma so that the precursor gases react in the plasma and deposit a thermal barrier coating on the metallic article.

21. A method as claimed in claim 20 additionally comprising supplying at least one gas into the sputtering chamber and applying a negative voltage to the metallic article to produce a plasma to clean the surface of the metallic article before depositing the thermal barrier coating.

22. A method as claimed in claim 20 wherein the precursor gases comprise zirconium chloride and yttrium chloride to deposit a yttria stabilised zirconia thermal barrier coating on the metallic article.

23. A method as claimed in claim 20 comprising applying different negative voltages to the hollow cathode to produce layers in the thermal barrier coating which have different structures.

24. A method as claimed in claim 20 wherein the metallic article is selected from the group consisting of a nickel superalloy, a cobalt superalloy and an iron superalloy.

25. A method as claimed in claim 20 wherein the metallic article is selected from the group consisting of a turbine blade and a turbine vane.

26. An apparatus for applying a coating to a metallic article comprising a sputtering chamber having a first hollow cathode, the first hollow cathode comprising a material to form a protective coating, means to evacuate the sputtering chamber, means to apply a negative voltage to the first hollow cathode to produce a plasma and such that the material of the hollow cathode is sputtered onto the metallic article to produce the protective coating, means to apply a positive voltage to the metallic article to attract electrons from the plasma to heat the protective coating and so inter-diffuse the elements of the metallic article and the protective coating, and means to apply a negative voltage to the metallic article to attract ions from the plasma to bombard the protective coating to minimise defects in the protective coating.

27. An apparatus as claimed in claim 26 wherein the hollow cathode material is selected from the group consisting of aluminium, platinum, yttrium, chromium, MCrAlY where M is one or more of Fe, Ni and Co, and an alloy mixture of any two or more of aluminium, platinum, yttrium, chromium, and MCrAlY where M is one or more of Fe, Ni and Co.

28. An apparatus as claimed in claim 26 wherein the hollow cathode comprises a plurality of longitudinally arranged portions, and the portions comprise different materials.

29. An apparatus as claimed in claim 28 wherein the different materials are selected from the group consisting of aluminium, platinum, yttrium, chromium and MCrAlY where M is one or more of Fe, Ni and Co.

30. An apparatus as claimed in claim 26 comprising means to supply at least one gas into the sputtering chamber and means to apply a negative voltage to the metallic article to produce a plasma to clean the surface of the metallic article before depositing the protective coating.

31. An apparatus as claimed in claim 26 comprising means to alternately apply the positive voltage and the negative voltage to the metallic article.

32. An apparatus as claimed in claim 31 comprising means to select the magnitude and the duration of the positive voltage applied to the metallic article so that the elements from the protective coating diffuse into the metallic article.

33. An apparatus as claimed in claim 31 comprising means to select the magnitude and the duration of the positive voltage applied to the metallic article so that the elements from the metallic article diffuse into the protective coating.

34. An apparatus as claimed in claim 26 comprising means to supply a reactive gas into the sputtering chamber to form a dispersion strengthened protective coating.

35. An apparatus as claimed in claim 26 wherein the hollow cathode comprises one or more projections extending from the hollow cathode towards the metallic article.

36. An apparatus as claimed in claim 35 comprising arranging the length of the individual projections and/or the spacing between the projections to produce variations in the thickness of protective coating at regions on the metallic article.

37. An apparatus as claimed in claim 36 comprising forming some of the projections from different materials to the remaining projections to produce variations in the composition of the protective coating at a region on the metallic article.

38. An apparatus as claimed in claim 26 comprising forming a transverse portion of the hollow cathode from different materials to the remainder of the hollow cathode to produce a variation in the composition of the protective coating at a region on the metallic article.

39. An apparatus as claimed in claim 26 comprising a sputtering chamber having a second hollow cathode, the second hollow cathode comprising an inert material, means to supply precursor gases into the sputtering chamber, the precursor gases being suitable for forming a thermal barrier coating, and means to apply a negative voltage to the second hollow cathode to produce a plasma so that the precursor gases react in the plasma and deposit a thermal barrier coating on the protective coating.

40. An apparatus as claimed in claim 39 comprising means to supply at least one gas into the sputtering chamber having a second hollow cathode and means to apply a negative voltage to the metallic article to produce a plasma to clean the surface of the protective coating before depositing the thermal barrier coating.

41. An apparatus as claimed in claim 39 comprising means to apply different negative voltages to the second hollow cathode to produce layers in the thermal barrier coating.

42. An apparatus as claimed in claim 39, wherein the means to supply precursor gases comprises a supply of zirconium chloride and yttrium chloride.

43. An apparatus as claimed in claim 39 wherein the second hollow cathode is in a second sputtering chamber.

44. An apparatus as claimed in claim 43 wherein the first and second sputtering chambers are connected by an air lock.

* * * * *